US006998337B1

(12) United States Patent  
Tran (10) Patent No.: US 6,998,337 B1  
(45) Date of Patent: *Feb. 14, 2006

(54) THERMAL ANNEALING FOR CU SEED LAYER ENHANCEMENT

(75) Inventor: Minh Q. Tran, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 66 days.

This patent is subject to a terminal disclaimer.

(21) Appl. No.: 10/728,771

(22) Filed: Dec. 8, 2003

(51) Int. Cl.  
*H01L 21/44* (2006.01)  
*H01L 21/4763* (2006.01)

(52) U.S. Cl. ............... 438/618; 438/660; 438/687
(58) Field of Classification Search ................ 438/597, 438/618, 622, 642, 643, 660, 687  
See application file for complete search history.

(56) References Cited

U.S. PATENT DOCUMENTS

| 6,197,181 | B1 | | 3/2001 | Chen |
| 6,428,673 | B1 | * | 8/2002 | Ritzdorf et al. ............... 205/84 |
| 6,506,668 | B1 | * | 1/2003 | Woo et al. .................. 438/584 |
| 2002/0008036 | A1 | * | 1/2002 | Wang ......................... 205/118 |
| 2003/0020928 | A1 | * | 1/2003 | Ritzdorf et al. ............. 356/630 |
| 2003/0066752 | A1 | * | 4/2003 | Ritzdorf et al. ............... 205/82 |
| 2003/0159921 | A1 | * | 8/2003 | Harris et al. ............ 204/224 R |

* cited by examiner

*Primary Examiner*—Evan Pert (57) ABSTRACT

Semiconductor devices with highly reliable Cu interconnects exhibiting reduced resistance are formed by sequentially depositing a seed layer by PVD, depositing a conformal seed layer enhancement film by electroplating, and then thermal annealing the seed layer enhancement film in an inert or reducing atmosphere to expel impurities, enhance film conductivity, reduce film stress, increase film density, and reduce film roughness. Embodiments include single and dual Cu damascene techniques formed in dielectric layers having a dielectric constant no greater than about 3.9.

18 Claims, 9 Drawing Sheets

THERMAL ANNEALING FOR CU SEED LAYER ENHANCEMENT

FIELD OF THE INVENTION

The present invention relates to copper (Cu) and/or Cu alloy metallization in semiconductor devices, and to a method for manufacturing semiconductor devices with reliable, low resistance Cu or Cu alloy interconnects. The present invention is particularly applicable to manufacturing high speed integrated circuits having sub-micron design features and high conductivity interconnect structures.

BACKGROUND ART

The escalating demand for high density and performance impose severe requirements on semiconductor fabrication technology, particularly interconnection technology in terms of providing reliable low RxC (resistance x capacitance) interconnect patterns with higher electromigration resistance, wherein sub-micron vias, contacts and trenches have high aspect ratios.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometry shrinks to sub-micron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the RxC delay caused by the interconnect wiring increases. If the interconnection node is routed over a considerable distance, e.g., hundreds of microns or more as in sub-micron technologies, the interconnection capacitance limits the circuit node capacitance loading and, hence, the circuit speed. As design rules are reduced to about 0.12 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

Figure 1:
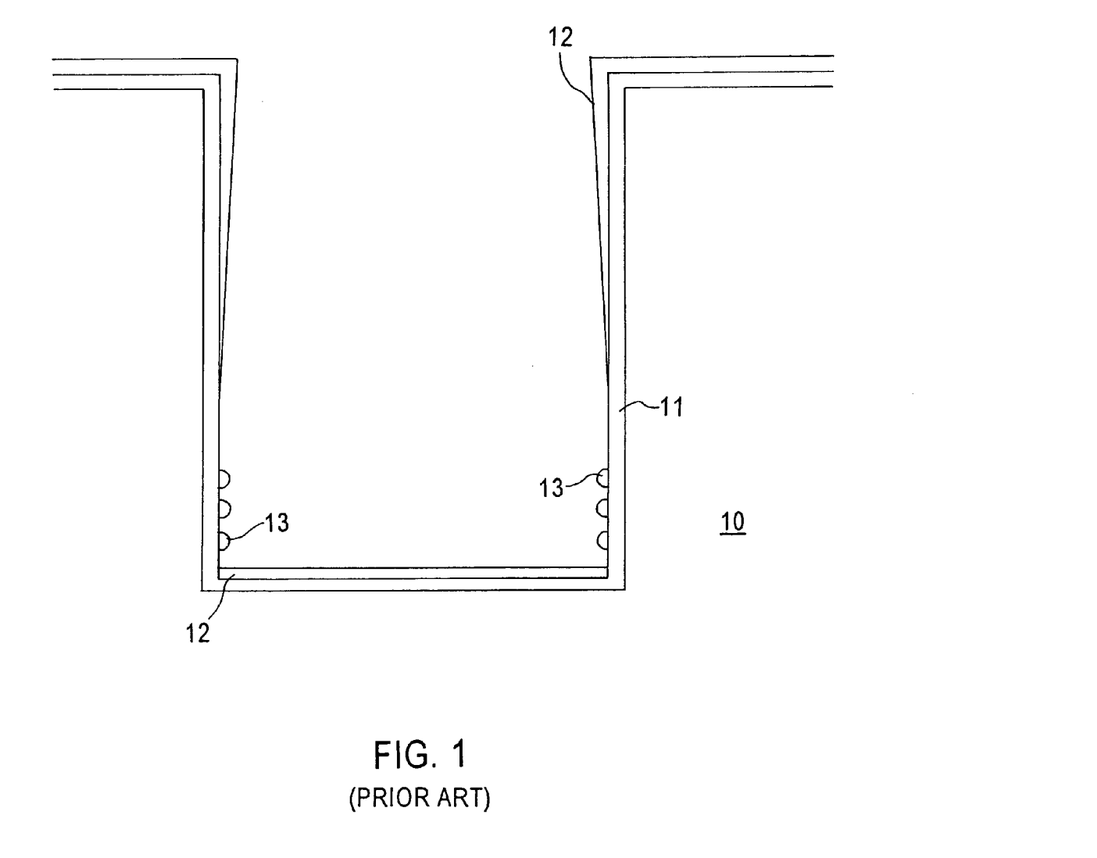
FIG. 1 schematically illustrates a discontinuous seed layer problem solved by the present invention.

In implementing Cu metallization, particularly in damascene techniques wherein an opening is formed in a dielectric layer, particularly a dielectric layer having a low dielectric constant, e.g., a dielectric constant less than about 3.9, various reliability, electromigration and resistance issues are generated. Reliability issues stem, in part, from the difficulty in forming a continuous seed layer on a barrier layer in an opening, particularly as the feature sizes continue to shrink into the deep sub-micron regime. For example, an opening is formed in dielectric layer 10, with barrier layer 11 lining the opening, as illustrated in FIG. 1. A seed layer 12 for deposition of Cu is then deposited by physical vapor deposition (PVD). As a result of reduced feature sizes and high aspect ratios, it is extremely difficult to deposit a continuous seed layer lining the sidewalls of the opening. Consequently, sidewall discontinuities in seed layer 12 form, as illustrated by reference numeral 13. In addition, it is even difficult to effectively plate the seed layer 12 on the bottom of the opening. Cu cannot be electroplated on a discontinuous seed layer or where no seed layer exists. Consequently, voids are induced leading to high resistance vias and lines or open circuits.

Figure 2:
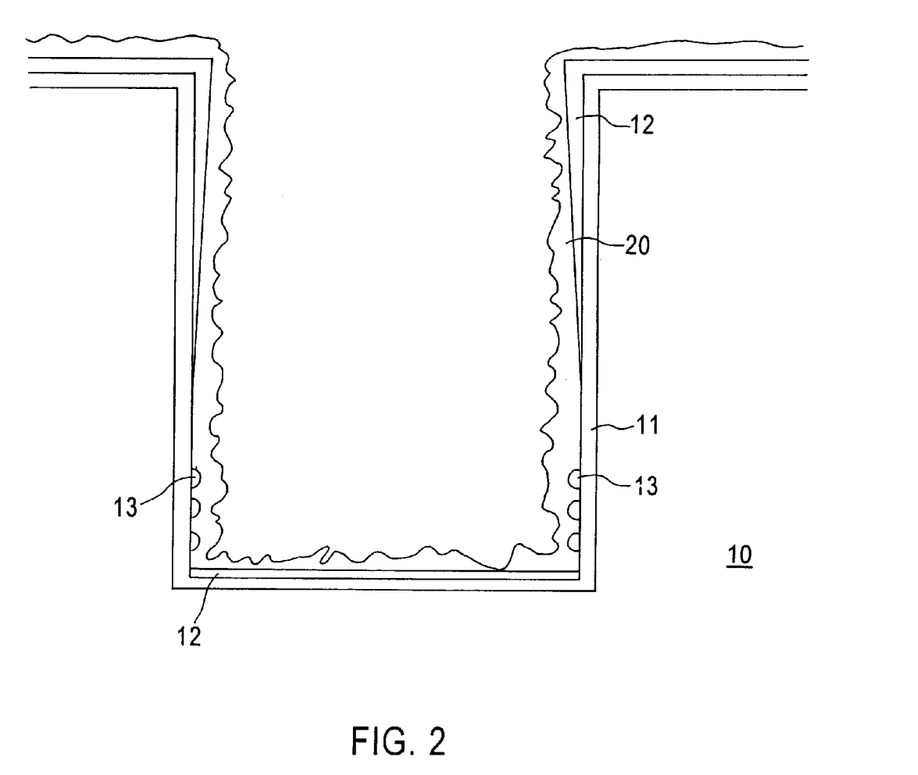
FIGS. 2 through 4 schematically illustrate sequential phases of a method in accordance with an embodiment of the present invention.

In U.S. Pat. No. 6,197,181 a method is disclosed comprising electroplating a seed layer enhancement film to repair discontinuities in the Cu seed layer resulting from poor step converage of thinner and thinner physical vapor deposition (PVD) due to an aggressive reduction in feature sizes. However, it was found that such seed layer enhancement films exhibit poor properties, such as an undesirable surface roughness, e.g., an average surface roughness (Ra) greater than 25 Å vis-à-vis an Ra of 5 Å to 7 Å for a conventionally deposited PVD Cu film. Such an undesirable surface roughness is schematically illustrated in FIG. 2, reference character 20 denoting the seed layer enhancement film. It was also found that such a seed layer enhancement film 20 not only exhibits an undesirable surface roughness but also undesirably high impurity concentrations of elements such as carbon, oxygen, nitrogen and hydrogen. In addition, such a seed layer enhancement film 20 exhibits an undesirably high film resistivity, e.g., 2.5 to 6 microOhm-cm vis-à-vis a resistivity of less than 2 microOhm-cm for conventional electroplated Cu films. In addition, it was found that such a seed layer enhancement film 20 contains pinhole voids. As a result, the subsequently deposited electroplated Cu film exhibits high resistivity, high surface roughness and voids, leading to significantly increased via/line resistance and lower circuit speed, in addition to generating electromigration and other reliability issues.

Accordingly, there exists a need for methodology enabling the formation of reliable Cu interconnects with reduced resistivity and reduced voids.

DISCLOSURE OF THE INVENTION

An advantage of the present invention is a method of manufacturing a semiconductor device having reliable, low resistance Cu or Cu alloy interconnects with significantly reduced voids.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming an opening in a dielectric layer; depositing a barrier layer lining the opening; depositing a seed layer for copper (Cu) or Cu alloy deposition on the barrier layer; depositing a conformal seed layer enhancement film by electroplating on the seed layer; thermal annealing the seed layer enhancement film; and filling the opening with Cu or a Cu alloy.

Embodiments include forming a dual damascene opening in dielectric material having a dielectric constant no greater than about 3.9, such as a fluorine (F)-containing oxide, such as an F-containing oxide derived from tetraethyl orthosilicate (TEOS), the opening comprising an upper trench section in communication with a lower via hole section; depositing a composite barrier layer lining the opening, the composite barrier layer comprising a layer of tantalum nitride and a layer of α-tantalum thereon; depositing a seed layer by PVD on the α-tantalum layer, the deposited seed layer having discontinuities, depositing a conformal seed layer enhancement film by electroplating bridging discontinuities in the seed layer and having a rough surface; thermal annealing the seed layer enhancement film by heating, as in a furnace or by lamp annealing, in an inert atmosphere, such as nitrogen or argon, or in a reducing gas atmosphere, such as a forming gas comprising hydrogen and nitrogen, to reduce the roughness and resistivity of the seed layer enhancement film; and filling the opening with Cu or a Cu alloy to form a Cu or Cu alloy line in communication with an underlying Cu or Cu alloy via. Embodiments of the present invention include annealing by heating in a furnace to a temperature of about 100° C. to about 250° C. for about 1 minute to about 30 minutes.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

The present invention addresses and solves various problems attendant upon forming metallized interconnects, such as Cu or Cu alloy interconnects, particularly, damascene structures in dielectric layer(s) having a dielectric constant less than about 3.9. As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

As design rules are scaled down into the deep sub-micron range, such as about 0.12 micron and under, reliability and contact resistance issues associated with interconnects, particularly Cu interconnects, become increasingly significant. Reliability and contact resistance issues stem, in part, from the inability to deposit a continuous seed layer for Cu deposition, particularly as the dimensions shrink into the deep sub-micron regime and aspect ratios increase to over 4.5. As shown in FIG. 1, the deposition of a seed layer 12 by PVD results in sidewall discontinuities 13. Upon subsequent electroplating Cu, voids are formed leading to high resistance vias and lines or open circuits. An attempt to address this problem disclosed in U.S. Pat. No. 6,197,181 comprises depositing a seed layer enhancement film which is schematically illustrated in FIG. 2 and identified by reference numeral 20. However, it was found that such a seed layer enhancement film disadvantageously exhibits extremely poor properties, such as high surface roughness, high resistivity and pinhole voids, and contains high impurity concentrations, such as carbon, oxygen and hydrogen in elemental and/or compound form. As a result, the subsequently deposited electroplated Cu film exhibits high resistivity, high surface roughness, voids and a small grain size, leading to significantly increased via/line resistance and lower circuit speed, in addition to generating electromigration and other reliability issues.

In accordance with embodiments of the present invention, the inadequacies of the seed layer and seed layer enhancement film are addressed by strategically treating the exposed rough surface of seed layer enhancement film by thermal annealing to drive out the impurities from the seed layer enhancement film, thereby improving its properties for subsequent Cu electroplating. In accordance with embodiments of the present invention, the rough surface of the conformal seed layer enhancement film is heated, as to a temperature of about 100° C. to about 250° C., for about 1 minute to about 30 minutes, e.g. about 1 minute to about 5 minutes. Embodiments of the present invention include annealing in an inert atmosphere, such as nitrogen or argon, or in a reducing atmosphere, such as forming gas, e.g., a mixture of about 4 volume % hydrogen and about 96 volume % nitrogen, to prevent oxidation of the seed layer enhancement film. During such thermal annealing, impurities are driven out, thereby enhancing film conductivity, reducing film stress, densifying the film and significantly reducing film roughness. The removal of impurities during thermal annealing advantageously prevents subsequent out-gassing and, hence, reduces voiding. An additional benefit of thermal annealing comprises thinning the seed layer enhancement film at the bottom portion of the via and reducing the overhang of the conformal seed layer enhancement film, thereby insuring complete filling of openings with reduced voiding.

Figure 3:
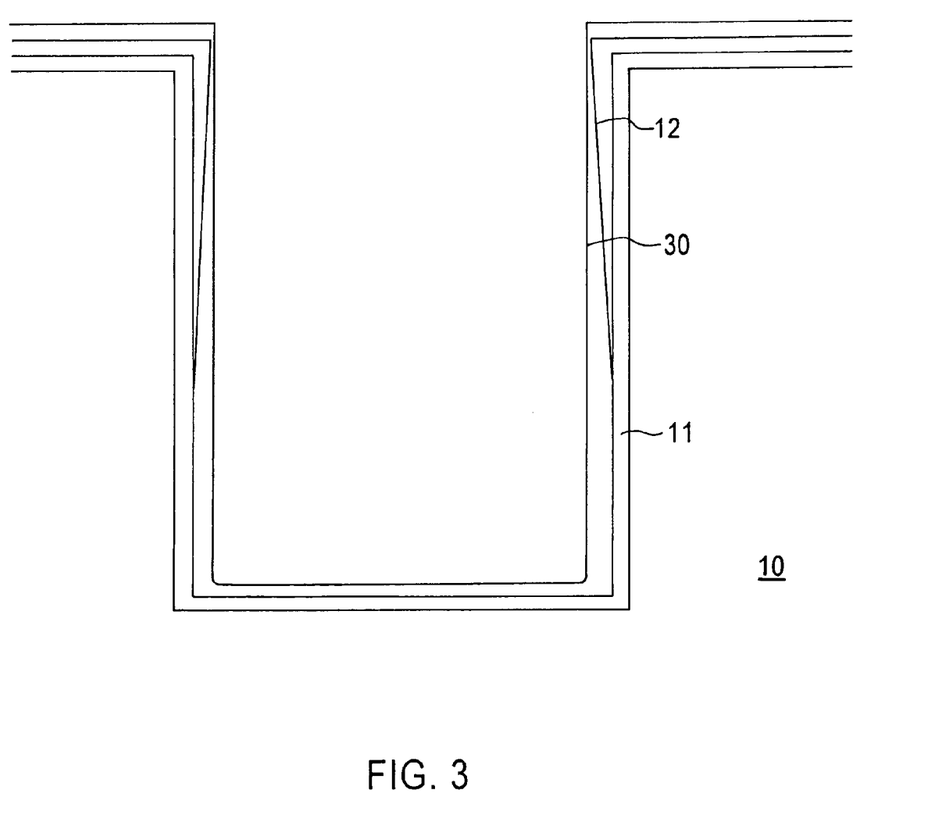

Thermal annealing in accordance with embodiments of the present invention enables a significant reduction in resistivity, such as 40% to 60%, e.g. 50%, and a significant reduction in the average surface roughness (Ra) of the seed layer enhancement film, e.g., a reduction of up to 30% in the Ra. The seed layer enhancement film 20 is heated, as in nitrogen flowing at about rate of 2000 to about 20,000 sccm, resulting in the modified seed layer enhancement film 30 illustrated in FIG. 3. The improved seed layer enhancement film 30 exhibits a smoother surface and is thinned somewhat at the bottom and corners, thereby reducing contact resistance and improving filling. Thermal annealing drives out impurities, such as carbon, oxygen and hydrogen, thereby preventing subsequent voiding in the deposited Cu induced by outgassing during later processing.

Embodiments of the present invention comprise depositing a composite barrier layer of tantalum nitride and α-tantalum thereon, at an equivalent surface deposition thickness of about 100 Å to 400 Å, i.e., the thickness on a wafer surface without topographical features, wherein the thickness of the composite barrier layer within the opening is about 7 Å to 40 Å. A PVD Cu seed layer is then deposited, such as at an equivalent surface deposition thickness of about 300 Å to 1,500 Å, e.g., 1,000 Å, wherein the thickness within the opening is of about 20 Å to about 100 Å. The conformal Cu seed layer enhancement film is then deposited and thermally annealed. The resulting Cu seed layer enhancement film has an aggregate carbon, nitrogen, oxygen and hydrogen impurity concentration no greater than 0.1 at. %.

The resistivity of the deposited seed layer enhancement film may be reduced from a deposited value of 2.5 to 6 microOhms-cm to an annealed value of 2.0 to 3 microOhm-cm. The average surface roughness (Ra) of the deposited seed layer enhancement film may be reduced from a deposited value of up to 40 Å to an annealed value of 19 Å to 25 Å.

Figure 4:
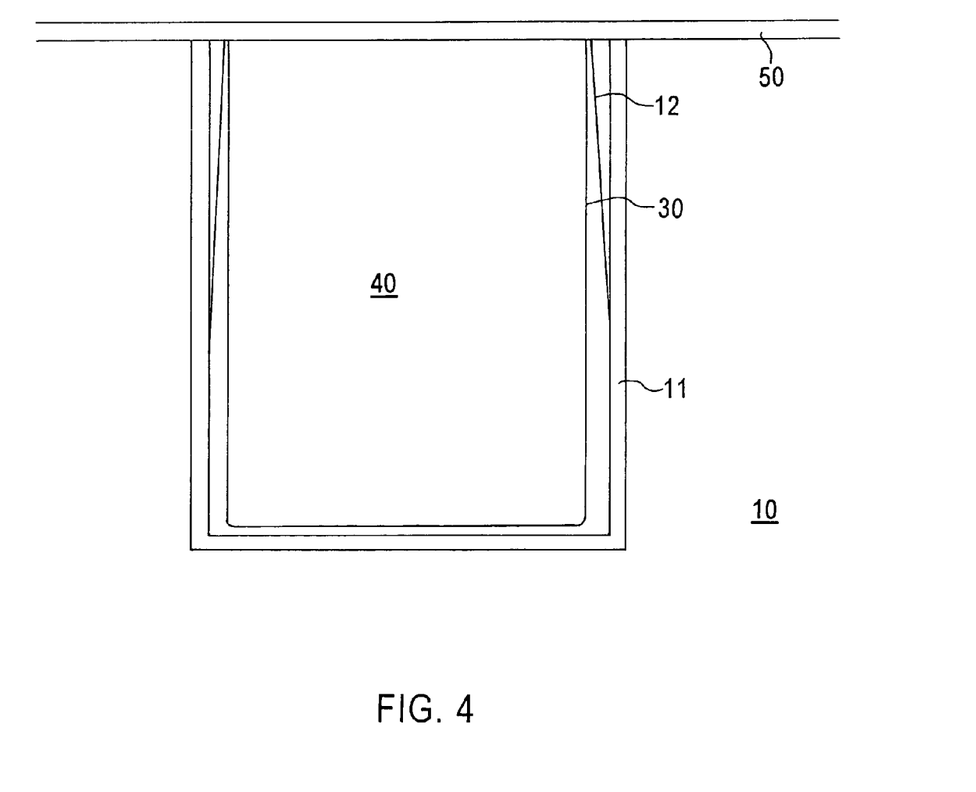
Figure 5:
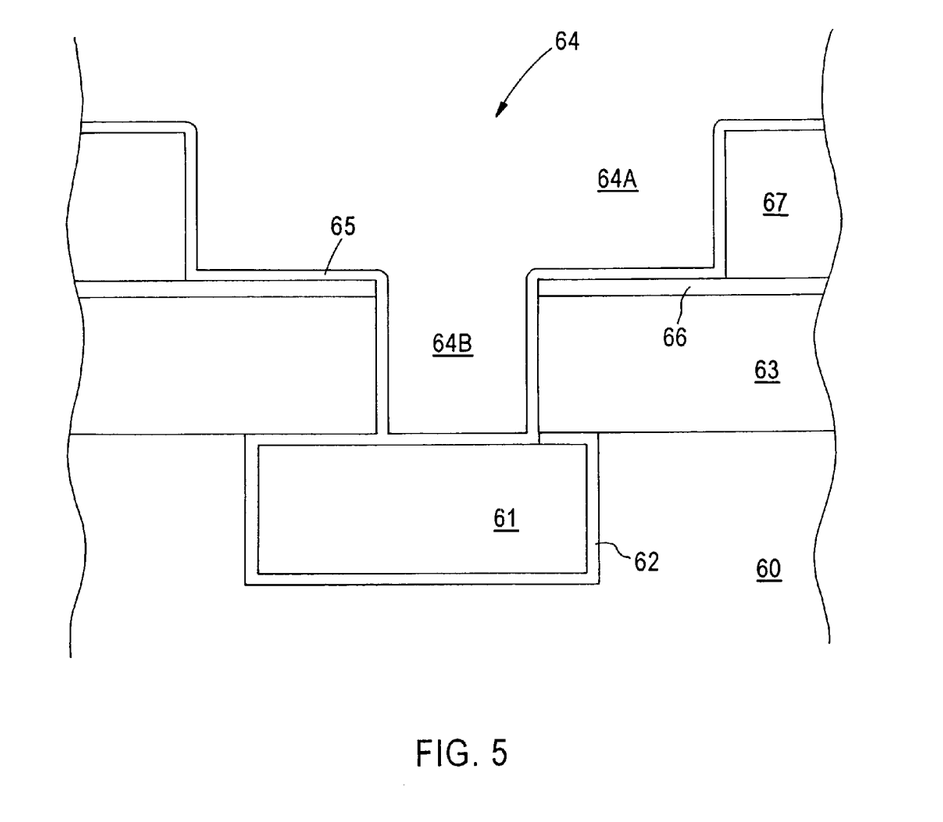
FIGS. 5 through 9 schematically illustrate sequential phases of a method in accordance with another embodiment of the present invention.

Subsequent processing includes electroplating copper 40 to fill the opening, as shown in FIG. 4, post-plate annealing, and chemical mechanical polishing (CMP) to reduce any overburden on the upper surface of dielectric layer 10, and depositing capping layer 50, such as silicon nitride or silicon carbide.

Another embodiment of the present invention is schematically illustrated in FIGS. 5 through 9, wherein similar features are denoted by similar reference numerals. Adverting to FIG. 5, a lower metal feature 61, such as a Cu line, is formed in an underlying dielectric layer 60, with a barrier layer 62 encapsulating metal feature 61. Dielectric layers 63 and 67 are deposited with a middle etch stop layer 66 therebetween. Dielectric layers 63 and 67 can comprise any of various dielectric materials conventionally employed and fabricating semiconductor devices, particularly low-k dielectric materials having a dielectric constant (k) no greater than about 3.9, such as F-TEOS. Middle etch stop layer 66 can comprise silicon nitride, silicon oxynitride or silicon carbide. A dual damascene opening 64 is then formed comprising upper trench 64A and lower via hole section 64B. Dual damascene opening 64 can be formed in a conventional manner, as by a conventional via first-trench last technique or a conventional trench first-via last technique. A barrier layer 65 is then deposited, such as a composite barrier layer comprising an initial layer of tantalum nitride and a layer of α-tantalum thereon. Composite barrier layer 65 can be formed at a combined equivalent surface deposition thickness of about 100 Å to about 400 Å, as by physical vapor deposition (PVD) techniques, such as ionized physical vapor deposition (IPVD), e.g., ionized sputtered deposition (ISD).

Figure 6:
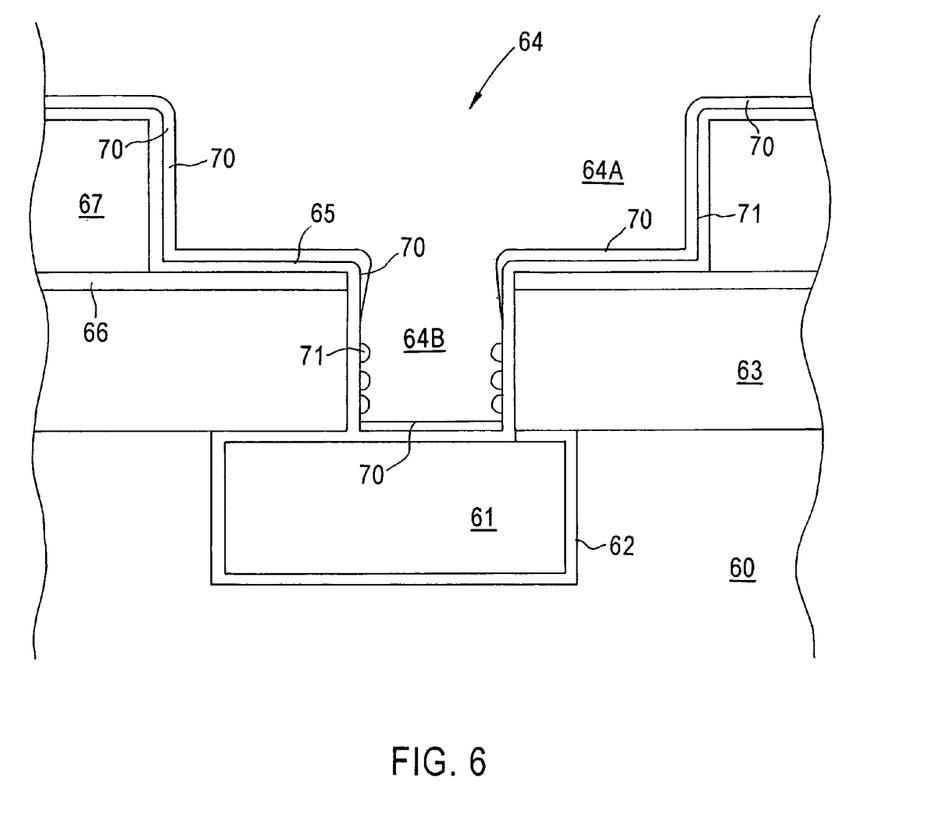

Subsequently, as schematically illustrated in FIG. 6, a seed layer 70 is deposited by PVD. Seed layer 70 is typically discontinuously formed, as illustrated by islands 71. Seed layer 70 may be formed at an equivalent surface deposition thickness of about 300 Å to about 1,500 Å, e.g., 1,000 Å, and may comprise a conventional seed layer material for Cu deposition, such as Cu itself or a Cu alloy containing magnesium, aluminum, zinc, zirconium, tin, nickel, palladium, silver or gold in a suitable amount, e.g., about 0.3 to about 12 at. %.

Figure 7:
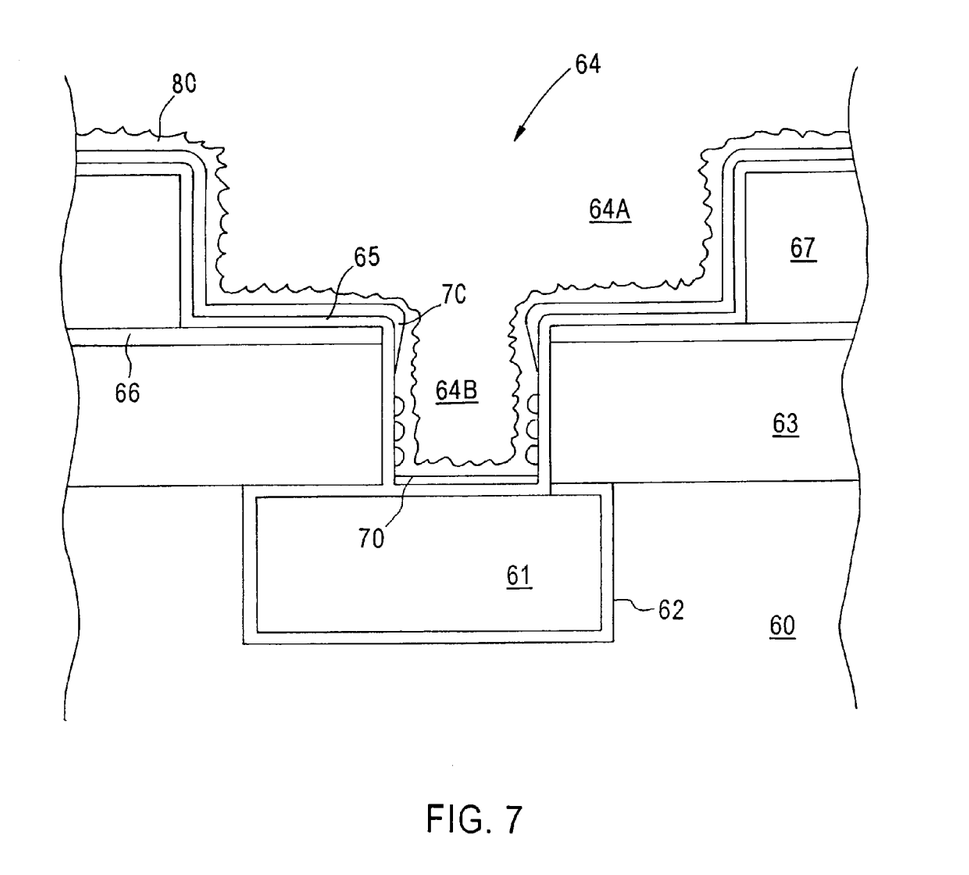
Figure 8:
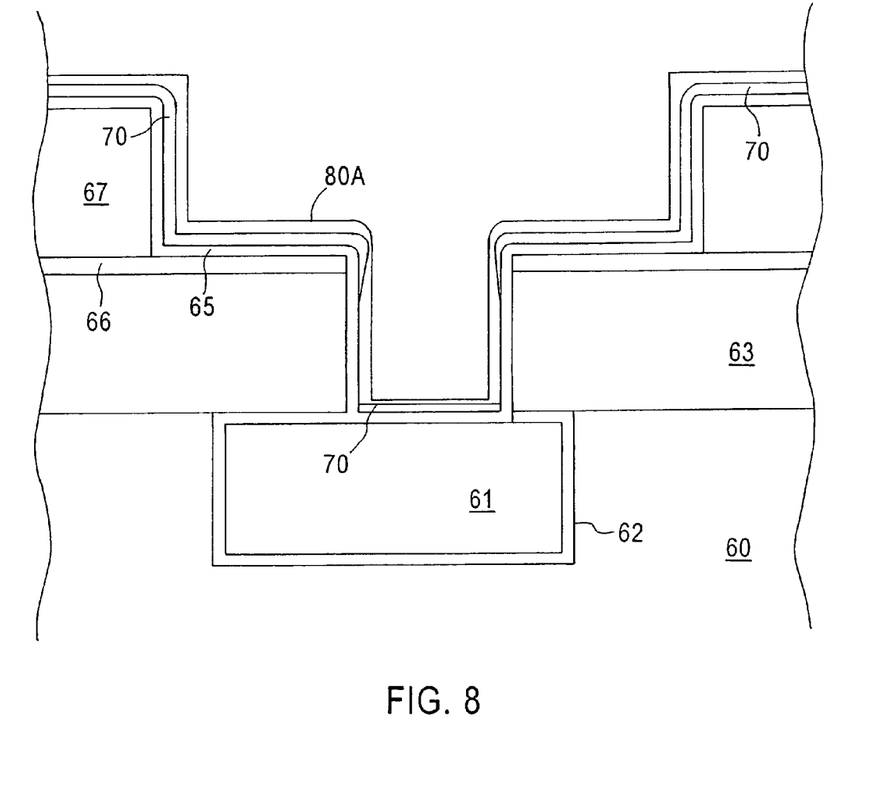

Subsequently, as schematically illustrated in FIG. 7, a conformal seed layer enhancement film 80 is electroplated, typically at a thickness of about 100 Å to about 200 Å. Since seed layer enhancement film 80 is conformal, its thickness on a flat surface is substantially the same as its thickness within an opening. Seed layer enhancement film 80 typically exhibits a rough surface and contains impurities which would out-gas during subsequent processing causing undesirable voids and increased resistance. In accordance with embodiments of the present invention, the seed layer enhancement film 80 is heated, as to a temperature of about 1001° C. to about 250° C. for about 1 minute to about 5 minutes, in nitrogen. During such thermal annealing, impurities, such as carbon, oxygen and hydrogen in the seed layer enhancement film 80A are driven out and the surface of seed layer enhancement film 80 significantly reduced in roughness. Thermal annealing also reduces film stress and increases the density of the film. The resulting structure is schematically illustrated in FIG. 8 having improved seed layer enhancement film 80A with a smooth surface.

Figure 9:
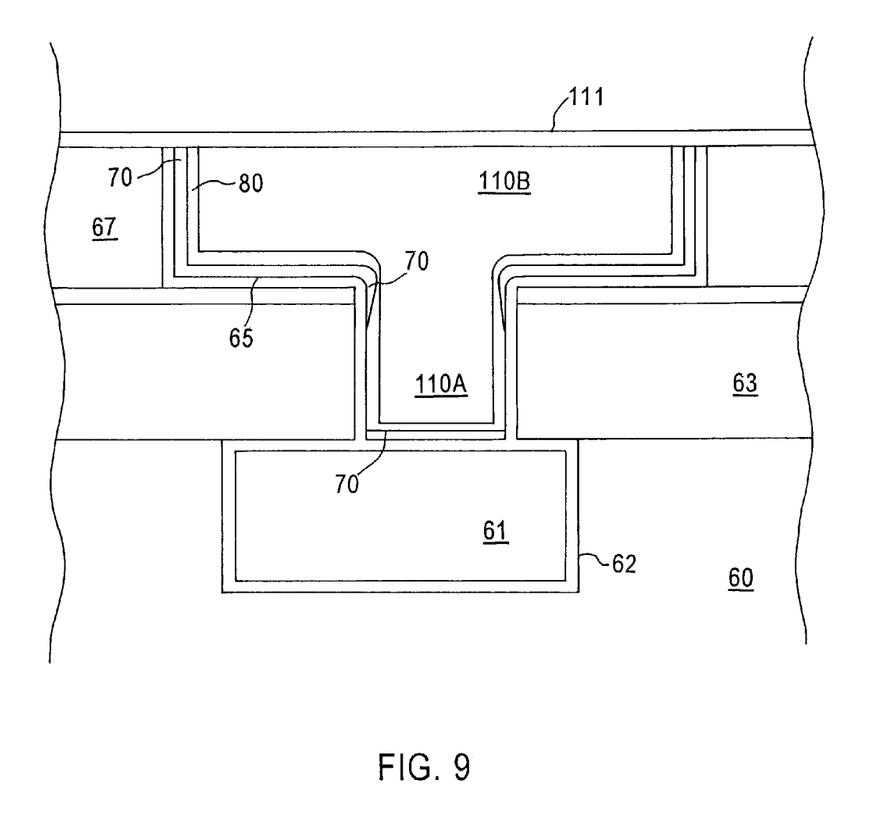

Subsequently, as schematically illustrated in FIG. 9, Cu is deposited, as by electroplating, to form a dual damascene structure comprising upper Cu line 100B in communication with lower Cu via 110A. After an annealing step to stabilize grain growth, CMP is then conducted to remove any overburden and a capping layer 111 is deposited, such as silicon nitride or silicon carbide.

The present invention advantageously enables fabricating semiconductor devices having sub-micron features with highly reliable Cu interconnects exhibiting significantly reduced voiding and reduced contact resistance. Problems attendant upon inadequate seed layer deposition and poor seed layer enhancement film formation are addressed and solved by thermally annealing to smooth the roughen surface of the seed layer enhancement film and drive out impurities, thereby enabling filling of the opening, particularly a dual damascene opening formed in low dielectric constant materials, with improved reliability reduced voiding and reduced contact resistance.

In various embodiments of the present invention, conventional substrates and interlayer dielectrics, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron- and phosphorus doped silicate glass (BPSG), and silicon dioxide derived from tetraethylorthosilicate (TEOS) or silane by PECVD can be employed. The openings formed in dielectric layers are effected by conventional photolithographic and etching techniques.

Advantageously, dielectric materials for use as interlayer dielectrics in accordance with embodiments of the present invention can comprise dielectric materials with lower values of permitivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include $FO_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and NanoglasS™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

In implementing embodiments of the present invention, suitable electrolytic baths may be formulated in accordance with the objective of depositing a conformal seed layer enhancement film and a suitable electrolytic bath to insure filling the opening with Cu to form the inteconnect. For example, the electrolytic bath solution for depositing the conformal seed layer enhancement film may be an alkaline copper bath in which copper ions are complexed with a complexing agent. A suitable source of copper ions is copper sulfate ($CuSO_4$). The concentration of copper sulfate in the bath may be within the range of 0.03 to 0.25 M, such as about 0.1 M.

Complexing agents suitable for use in embodiments of the present invention form a stable complex with copper ions and prevent the precipitation of copper hydroxide. Ethylene diamine tetracetic acid (EDTA), ethylene diamine (ED), citric acid, and their salts have been found to be particularly suitable copper complexing agents. The molar ratio of complexing agent to copper sulfate in the bath may be within the range of 1 to 4, e.g., about 2. Such complexing agents can be used alone, in combination with one another, or in combination with one or more further complexing agents.

The electrolytic bath may be maintained at a pH of at least 9.0. Potassium hydroxide, ammonium hydroxide, or sodium hydroxide may be utilized to adjust and maintain the pH at the desired level of 9.0 or above. A suitable pH for a citric acid or ED bath is about 9.5, while a suitable pH for an EDTA bath is about 12.5.

Additional components may be added to the alkaline copper bath. For example, boric acid ($H_3BO_3$) aids in maintaining the pH at 9.5 when citric acid or ED is used as the complexing agent, and provides brighter copper deposits when added to an electrolytic bath containing EDTA as the complexing agent. If boric acid is added, its concentration in the bath may be within the range of 0.01 to 0.5 M.

In general, the temperature of the bath may be within the range of 20 to 35° C., e.g., 25° C. The plating waveform may be, for example, a forward periodic pulse having a period of 2 msec at a 50% duty cycle.

An amine free acid complexing agent, for example, a polycarboxylic acid, such as citric acid, and salts thereof, may be used instead of EDTA or ED. EDTA and ED include amine groups which often remain on the surface of the semiconductor workpiece after rinsing and drying of the water. Subsequent processes, particularly such processes as photolithographic processes, may be corrupted by the reactions resulting from the presence of these amine groups. The amine groups may, for example, interfere with the chemical reactions associated with the exposing and/or curing of photoresist materials. As such, amine free complexing agents are particularly suitable in processes in which a photolithographic process follows and electrodeposition process.

Subsequent copper deposition may take place in an alkaline bath within the same apparatus employed to deposit the seed layer enhancement film However, subsequent copper deposition is desireably implemented in an acid environment where plating rates are substantially higher than corresponding rates associated with alkaline plating baths. To this end, the semiconductor workpiece may be transferred to an apparatus wherein the workpiece is thoroughly rinsed with deionized water and then transferred to the placing apparatus. For example, a suitable copper bath comprises 170 g/1$H_2SO_4$, 17 g/1 copper and 70 ppm chloride ions with optional organic additives to produce desired film characteristics and provide better filling of the recessed structures on the wafer surface. The organic additives may include levelers, brighteners, wetting agents and ductility enhancers.

Use of an alkaline electrolytic bath to deposit the conformal Cu seed layer enhancement film has particular advantages over utilizing acid copper baths without seed layer enhancement. After deposition of the PVD Cu seed layer, the Cu seed layer is typically exposed to an oxygen-containing environment converting metallic Cu to copper oxide. If an acid Cu bath is used to plate Cu onto the seed layer after exposure of the seed layer to an oxygen containing environment, the acid Cu bath would dissolve copper oxide that had formed, resulting in voids in the seed layer and poor uniformity of the cu layer deposited on the seed layer. Use of an alkaline Cu bath avoids the problment by advantageously reducing any copper oxide at the surface of the seed layer to metallic Cu.

The present invention enjoys industrial applicability in fabricating various types of semiconductor devices comprising interconnects, particularly inlaid Cu metallization interconnection patterns. The present invention enjoys particularly industrial applicability in fabricating semiconductor devices having sub-micron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A method of manufacturing a semiconductor device, the method comprising:
   forming an opening in a dielectric layer;
   depositing a barrier layer lining the opening;
   depositing a seed layer for copper (Cu) or Cu alloy deposition on the barrier layer;
   depositing a conformal seed layer enhancement film by electroplating on the seed layer;
   thermal annealing the seed layer enhancement film; and
   filling the opening with Cu or Cu alloy after said thermal annealing the seed layer enhancement film.

2. The method according to claim 1, comprising depositing the seed layer by physical vapor deposition, wherein the deposited seed layer exhibits discontinuities.

3. The method according to claim 2, wherein the seed layer comprises Cu or Cu alloy.

4. The method according to claim 2, comprising depositing the seed layer at an equivalent surface deposition thickness of 300 Å to about 1,500 Å.

5. The method according to claim 2, comprising depositing the seed layer enhancement film as a conformal film bridging the discontinuities in the seed layer.

6. The method according to claim 5, comprising depositing the conformal seed layer enhancement film at a thickness of about 50 Å to about 300 Å.

7. The method according to claim 1, comprising thermal annealing by heating at a temperature of about 100° C. to about 250° C.

8. The method according to claim 7, comprising thermal annealing in an inert or reducing atmosphere.

9. The method according to claim 8, comprising thermal annealing in an atmosphere comprising nitrogen, argon or a forming gas mixture containing hydrogen and nitrogen.

10. The method according to claim 9, comprising thermal annealing for about 1 minute to about 30 minutes.

11. The method according to claim 1, comprising depositing a composite barrier layer comprising a tantalum nitride layer lining the opening and a layer of a-tantalum on the tantalum nitride layer.

12. The method according to claim 1, wherein the opening comprises a dual damascene opening having a lower via hole section in communication with an upper trench section, the method comprising filling the opening with Cu or Cu alloy to form a lower via in communication with an upper line.

13. The method according to claim 12, comprising depositing the composite barrier layer at a combined equivalent surface deposition thickness of 100 Å to 400 Å.

14. The method according to claim 12, wherein the dual damascene opening is formed in dielectric material having a dielectric constant no greater than about 3.9.

15. The method according to claim 14, wherein the dual damascene opening is formed in dielectric material comprising a fluorine (F)-containing oxide.

16. The method according to claim 5, wherein the deposited seed layer enhancement film exhibits a rough surface, the method comprising thermal annealing to reduce the roughness of the seed layer enhancement film.

17. The method according to claim 16, wherein the deposited seed layer enhancement film exhibits an average surface roughness (Ra) up to 40 Å, the method comprising thermal annealing to reduce the Ra of the seed layer enhancement film to about 19 Å to about 25 Å.

18. The method according to claim 16, wherein the deposited seed layer enhancement film exhibits a resistivity of about 2.5 to about 6 microOhm-cm, the method comprising thermal annealing to reduce the resistivity of the seed layer enhancement film to about 2.0 to about 3 microOhm-cm.

* * * * *